(12) United States Patent
Chou et al.

(10) Patent No.: US 11,488,899 B2
(45) Date of Patent: Nov. 1, 2022

(54) PACKAGE DEVICE

(71) Applicant: InnoLux Corporation, Miao-Li County (TW)

(72) Inventors: Hsueh-Hsuan Chou, Miao-Li County (TW); Chia-Chieh Fan, Miao-Li County (TW); Kuan-Jen Wang, Miao-Li County (TW); Cheng-Chi Wang, Miao-Li County (TW); Yi-Hung Lin, Miao-Li County (TW); Li-Wei Sung, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 9 days.

(21) Appl. No.: 16/941,516

(22) Filed: Jul. 28, 2020

(65) Prior Publication Data
US 2020/0357732 A1 Nov. 12, 2020

Related U.S. Application Data

(63) Continuation of application No. 16/018,003, filed on Jun. 25, 2018, now abandoned.
(Continued)

(51) Int. Cl.
*H01L 23/498* (2006.01)
*H01L 23/31* (2006.01)
(Continued)

(52) U.S. Cl.
CPC .... *H01L 23/49822* (2013.01); *H01L 21/4853* (2013.01); *H01L 21/4857* (2013.01); *H01L 21/4864* (2013.01); *H01L 21/568* (2013.01); *H01L 21/6835* (2013.01); *H01L 23/3114* (2013.01); *H01L 23/3142* (2013.01); *H01L 23/49816* (2013.01); *H01L 23/49838* (2013.01); *H01L 21/561* (2013.01); *H01L 23/3128* (2013.01); *H01L 23/49811* (2013.01); *H01L 24/13* (2013.01); *H01L 24/16* (2013.01); *H01L 24/81* (2013.01); *H01L 24/97* (2013.01); *H01L 25/0655* (2013.01); *H01L 25/50* (2013.01); *H01L 2221/68345* (2013.01); *H01L 2221/68359* (2013.01); *H01L 2221/68381* (2013.01); *H01L 2224/13111* (2013.01); *H01L 2224/13144* (2013.01); *H01L 2224/13155* (2013.01); *H01L 2224/16238* (2013.01);
(Continued)

(58) Field of Classification Search
CPC .......... H01L 23/49838; H01L 23/3114; H01L 23/49816; H01L 24/16; H01L 24/13; H01L 25/50; H01L 2924/15311; H01L 23/3128
See application file for complete search history.

(56) References Cited

U.S. PATENT DOCUMENTS 7,064,012 B1 * 6/2006 Lin .................. H01L 23/49816
257/E21.175
7,309,647 B1 * 12/2007 Nguyen ............... H05K 3/3463
257/772

(Continued)

*Primary Examiner* — Nicholas J Tobergte
(74) *Attorney, Agent, or Firm* — Winston Hsu

(57) ABSTRACT

The present disclosure provides a package device including a conductive pad, a protecting block, and a redistribution layer. The protecting block is disposed on the conductive pad. The redistribution layer is disposed on the protecting block, and the conductive pad is electrically connected to the redistribution layer through the protecting block.

9 Claims, 10 Drawing Sheets

Related U.S. Application Data

(60) Provisional application No. 62/538,808, filed on Jul. 31, 2017.

(51) Int. Cl.
  H01L 21/683 (2006.01)
  H01L 21/48 (2006.01)
  H01L 21/56 (2006.01)
  H01L 23/00 (2006.01)
  H01L 25/00 (2006.01)
  H01L 25/065 (2006.01)

(52) U.S. Cl.
  CPC ............... *H01L 2224/81005* (2013.01); *H01L 2224/81192* (2013.01); *H01L 2224/81805* (2013.01); *H01L 2224/95001* (2013.01); *H01L 2224/97* (2013.01); *H01L 2924/14* (2013.01); *H01L 2924/15311* (2013.01); *H01L 2924/15313* (2013.01); *H01L 2924/18161* (2013.01); *H01L 2924/37001* (2013.01)

(56) References Cited

U.S. PATENT DOCUMENTS

| | | | | |
|---|---|---|---|---|
| 7,932,601 | B2 * | 4/2011 | Chang | H01L 24/13 257/738 |
| 8,884,433 | B2 * | 11/2014 | Lin | H01L 24/12 257/691 |
| 8,901,733 | B2 * | 12/2014 | Huang | H01L 24/05 257/781 |
| 9,972,505 | B2 * | 5/2018 | Matsumoto | H01L 24/03 |
| 10,163,798 | B1 * | 12/2018 | Alur | H01L 24/16 |
| 2002/0096757 | A1 * | 7/2002 | Takao | H01L 23/528 257/E23.021 |
| 2009/0057895 | A1 * | 3/2009 | Lin | H01L 24/48 257/737 |
| 2014/0070420 | A1 * | 3/2014 | Sapone | H01L 23/5389 257/773 |
| 2015/0187710 | A1 * | 7/2015 | Scanlan | H01L 24/92 257/777 |
| 2016/0181184 | A1 * | 6/2016 | Matsumoto | H01L 24/03 257/751 |

* cited by examiner

PACKAGE DEVICE

CROSS REFERENCE TO RELATED APPLICATIONS

The present application is a continuation application of U.S. patent application Ser. No. 16/018,003, filed on Jun. 25, 2018, which claims the benefit of U.S. provisional patent application Ser. No. 62/538,808, filed on Jul. 31, 2017 and claims the benefit of China application Ser. No. 201711433952.2, filed on Dec. 26, 2017, and the entire contents of which are incorporated herein by reference.

BACKGROUND OF THE DISCLOSURE

1. Field of the Disclosure

The present disclosure relates to a package device and a manufacturing method thereof, and more particularly, to a package device and a manufacturing method thereof utilizing a fan-out panel level package (FOPLP) technology.

2. Description of the Prior Art

In electronic package technologies, fan-out wafer level package (FOWLP) technology includes forming electronic devices on wafer, performing packaging process and cutting process. However, the diameter of regular large-size wafer nowadays is only about 300 mm, thus the amount of electronic devices that can be manufactured and packaged on a wafer at the same time is limited. Hence, the fan-out panel level package (FOPLP) technology is developed in this related art to replace the FOWLP technology.

In the current FOPLP technology, a redistribution layer is generally formed on a hard carrier substrate and followed by disposing an electronic device on the redistribution layer, and then, the carrier substrate is released from the redistribution layer. However, in a bottom of the redistribution layer, besides a conductive pad is exposed, a dielectric layer of the redistribution layer is also exposed, such that the dielectric layer is easily over-etched as compared with the conductive pad during a clean and etching process, thereby damaging the structure in the redistribution layer and affecting characteristics of the whole package device. Accordingly, the conventional FOPLP method still needs to be further improved.

SUMMARY OF THE DISCLOSURE

An embodiment of the present disclosure provides a package device including a conductive pad, a protecting block and a redistribution layer. The protecting block is disposed on the conductive pad. The redistribution layer is disposed on the protecting block, and the conductive pad is electrically connected to the redistribution layer through the protecting block.

An embodiment of the present disclosure provides a manufacturing method of a package device. First, a release layer is formed on a carrier substrate. Then, a protecting layer and a conductive pad are formed on the release layer, in which the protecting layer is in contact with the conductive pad. Thereafter, a redistribution layer is formed on the protecting layer and the conductive pad. Later, the release layer and the carrier substrate are removed and followed by etching the protecting layer.

In the package device and the manufacturing method thereof of the present disclosure, between forming the release layer and forming the redistribution layer, the protecting layer is further formed to fully cover the release layer, so as to protect the formed redistribution layer from damage during the cleaning process or the etching process. Accordingly, the cleaning process may effectively clean the protecting layer or the bottom surface of the conductive pads. For this reason, the solder balls are helped to be adhered to the bottom surfaces of the conductive pads, so as to avoid high resistance generated from insufficient bonding between the solder balls and the conductive pads or avoid the open-circuit resulted from the solder balls coming off the conductive pads, thereby increasing the product yield.

These and other objectives of the present disclosure will no doubt become obvious to those of ordinary skill in the art after reading the following detailed description of the embodiment that is illustrated in the various figures and drawings.

DETAILED DESCRIPTION

Figure 1:
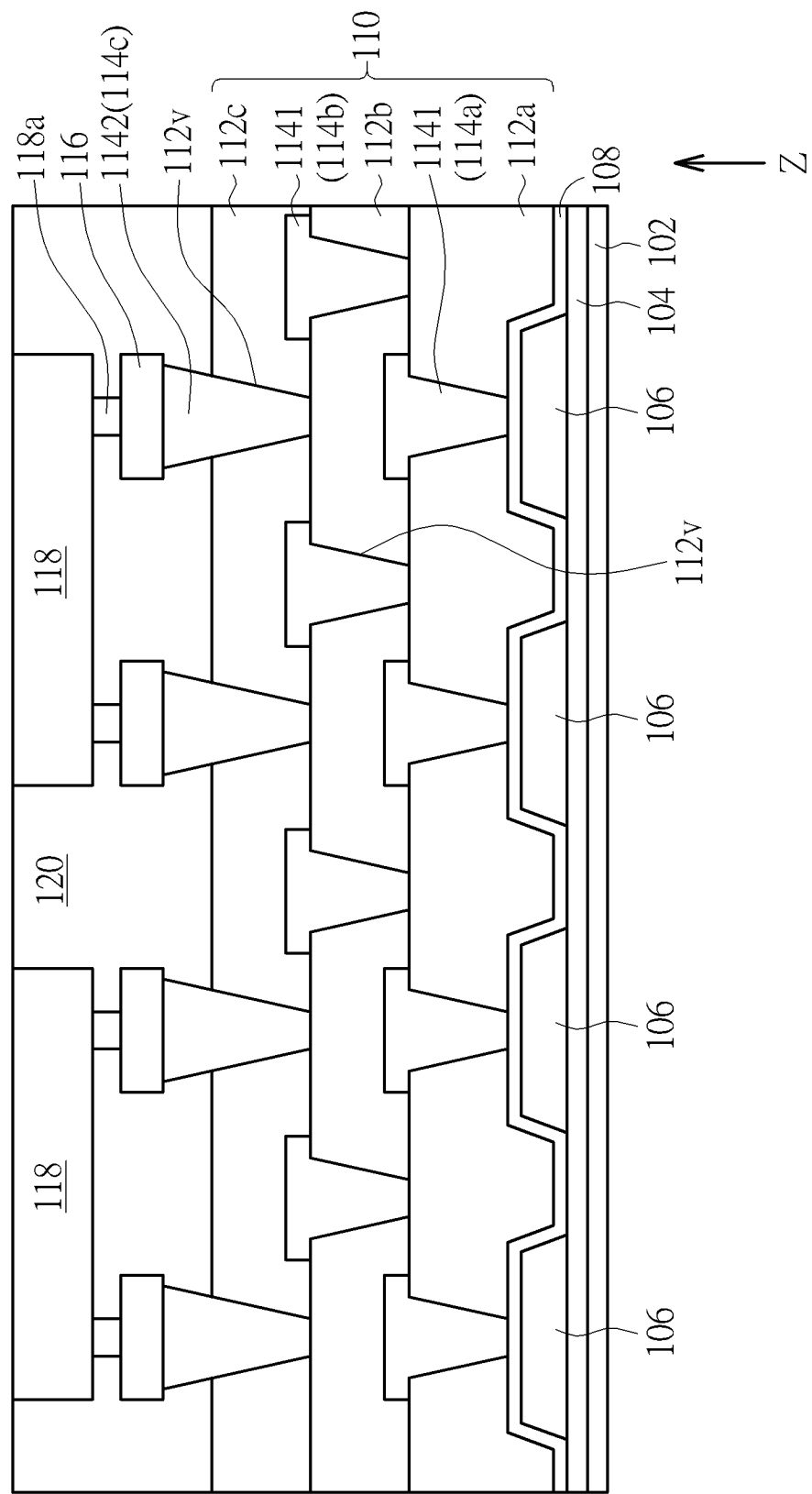
FIG. 1 and FIG. 2 are schematic diagrams illustrating a manufacturing method of a package device according to a first embodiment of the present disclosure.

To provide a better understanding of the present disclosure to those skilled in the art, embodiments will be detailed as follows. The embodiments of the present disclosure are illustrated in the accompanying drawings with numbered elements to elaborate on the contents and effects to be achieved. It is needed to note that the drawings are simplified schematic diagrams, and therefore, the drawings show only the components and combinations associated with the present disclosure, so as to provide a clearer description of the basic architecture or method of implementation of the present disclosure. The components would be complex in reality. In addition, for explanation, the components shown in the drawings of the present disclosure are not drawn to the actual number, shape, and dimensions, and the detail can be adjusted according to the design requirements. When the terms "include", "comprise" and/or "have" are used in the description of the present disclosure, the corresponding features, areas, regions, steps, operations and/or components would be pointed to existence, but not limited the existence or addition of one or more corresponding or other features, areas, regions, steps, operations and/or components. When the corresponding component such as layer or area is referred to "on another component (or the variant thereof)" or "extend to another component", it may be directly on another component or directly extend to another component, or other component may exist between them. On the other hand, when the component is referred to "directly on another component (or the variant thereof)" or "directly extend to another component", any component does not exist between them. And, when the component is referred to "be coupled to another component (or the variant thereof)", it may be directly connected to the another component, or may be indirectly connected (such as electrically connected) to the another component through other component or components.

It should be noted that the technical features in different embodiments described in the following can be replaced, recombined, or mixed with each other to constitute another embodiment without departing from the spirit of the present disclosure.

Figure 2:
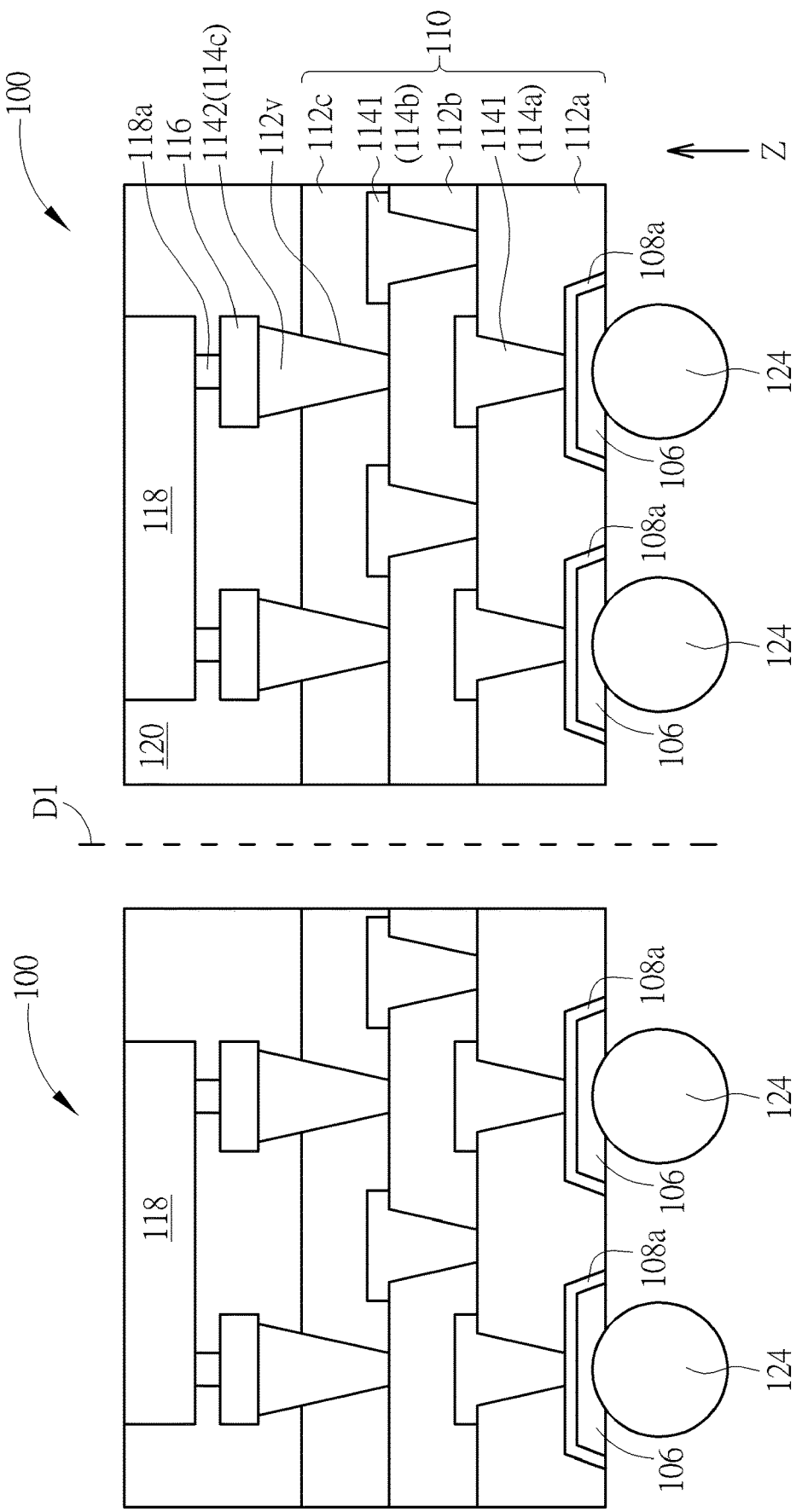

FIG. 1 and FIG. 2 are schematic diagrams illustrating a manufacturing method of a package device according to a first embodiment of the present disclosure, in which device structures in each step are illustrated in a cross-sectional view. The manufacturing method of the package device according to the first embodiment of the present disclosure includes the following steps. Referring to FIG. 1, a carrier substrate 102 is first provided to support devices formed in the following steps. The carrier substrate 102 may be for example a hard carrier substrate, such as glass substrate, or a flexible carrier substrate, such as polyimide (PI) or polyethylene terephthalate (PET), in which the flexible carrier substrate is further disposed on a hard carrier, but the present disclosure is not limited thereto. In this embodiment, a width of the carrier substrate 102 in any direction may be at least 400 mm, and a shape of the carrier substrate 102 may be rectangular, square, circular, polygonal, or any free-shaped, but the present disclosure is not limited thereto. For example, the carrier substrate 102 may be glass substrate which has a length ranging from 650 mm to 2500 mm and a width ranging from 500 mm to 2200 mm, such as carrier substrate of 550 mm (length)×650 mm (width) or carrier substrate of 600 mm (length)×720 mm (width), but not limited thereto. Then, a release layer 104 is formed on the carrier substrate 102. The release layer 104 includes a release material with releasing ability, which is used to separate the carrier substrate 102 and the formed devices after finishing the following steps. Based on different base materials, the described release layer 104 may be divided into PE release film, PET release film, OPP release film, composite release film (which base material is formed by combining two or more materials), etc., but the present disclosure is not limited thereto. After that, at least one conductive pad 106 is formed on the release layer 104. In this embodiment, the number of the conductive pad 106 is plural, and the conductive pads 106 are separated from each other, so that the conductive pads 106 may be used to be electrically connected to different signals, but the present disclosure is not limited thereto. Specifically, method for forming the conductive pads 106 may for example include forming a conductive layer (not shown) on a whole top surface of the release layer 104 and then performing a patterning process, such as a photolithography and etching process, on the conductive layer. The conductive pads 106 of this embodiment may for example include a metal material, such as iron, aluminum, copper or composite metal material, so as to reduce resistance for transferring signals.

Subsequently, a protecting layer 108 is formed on the release layer 104 and the conductive pads 106. In this embodiment, the protecting layer 108 fully cover the conductive pads 106 and the release layer 104, and the protecting layer 108 includes a conductive material, for example the conductive material is a metal material or a transparent conductive material, such as indium tin oxide, but the present disclosure is not limited thereto. The protecting layer 108 and the conductive pads 106 may be for instance formed of a same material, but the present disclosure is not limited thereto. In order to facilitate the following etching to the protecting layer 108, a thickness of the conductive pad 106 is greater than a thickness of the protecting layer 108, for example the thickness of the conductive pad 106 is 10 times greater than the thickness of the protecting layer 108. The thickness of the conductive pad 106 may be for example about several ten thousand angstroms to several hundred thousand angstroms, and the thickness of the protecting layer 108 may be for example about several angstroms to several thousand angstroms. In addition, in other embodiments, when materials with large difference in etching rate are respectively applied to the conductive pads 106 and the protecting layer 108, the thickness of the conductive pad 106 may be equal to the thickness of the protecting layer 108. Or, the thickness of the conductive pad 106 and the thickness of the protecting layer 108 may be designed to be different according to the difference in etching rate. In one embodiment, when the etching rate to the material of the conductive pad 106 is faster than the etching rate to the material of the protecting layer 108, the thickness of the conductive pad 106 may be greater than the thickness of the protecting layer 108. In another embodiment, if the etching rate to the material of the conductive pad 106 is less than the etching rate to the material of the protecting layer 108, the thickness of the conductive pad 106 may be less than the thickness of the protecting layer 108, but the present disclosure is not limited herein.

Later, the redistribution layer 110 is formed on the protecting layer 108, in which the redistribution layer 110 includes at least one dielectric layer and at least one patterned conductive layer. In this embodiment, the redistribution layer 110 may include a plurality of dielectric layers and a plurality of patterned conductive layers, but the present disclosure is not limited thereto. Each dielectric layer and each patterned conductive layer may be stacked alternately on the protecting layer 108, in which each dielectric layer may have a plurality of through holes 112v therein, and the through holes 112v penetrates through the corresponding dielectric layer. Each patterned conductive layer may be filled into the through holes 112v of the dielectric layer thereunder, so that the patterned conductive layer on each dielectric layer may be electrically connected to the patterned conductive layer or the conductive pad 106 under the corresponding dielectric layer. For this reason, the patterned conductive layer on the top surface of the redistribution layer 110 may be electrically connected to the conductive pads 106 on the bottom surface of the redistribution layer 110, so as to achieve wire redistribution. For example, the dielectric layer may include a first dielectric layer 112a, a second dielectric layer 112b and a third dielectric layer 112c, and the patterned conductive layer may include a first patterned conductive layer 114a, a second patterned conductive layer 114b and a third patterned conductive layer 114c. A method for forming the dielectric layer and the patterned conductive layer may include the following steps. First, the first dielectric layer 112a is formed on the protecting layer 108 and followed by performing a photolithography and etching process to form the through holes 112v in the first dielectric layer 112a, in which each through hole 112v exposes a corresponding conductive pad 106. Then, a conductive layer (not shown in figures) is formed on the first dielectric layer 112a and filled into the through holes 112v. Thereafter, the conductive layer is patterned by another photolithography and etching process, so as to form the first patterned conductive layer 114a including a plurality of conductive lines 1141. After that, processes similar to the processes for forming the first dielectric layer 112a and the first patterned conductive layer 114a may be utilized to sequentially form the second dielectric layer 112b, the second patterned conductive layer 114b, the third dielectric layer 112c and the third patterned conductive layer 114c, in which the second patterned conductive layer 114b may include a plurality of conductive lines 1141, and the third patterned conductive layer 114c may include a plurality of pads 1142 exposed at the top surface of the redistribution layer 110. Through the through holes 112v of the third dielectric layer 112c, the conductive lines 1141 of the second patterned conductive layer 114b, the through holes 112v of the second dielectric layer 112b, the conductive lines 1141 of the first patterned conductive layer 114a and the through hole 112v of the first dielectric layer 112a, each pad 1142 of the third patterned conductive layer 114c may be electrically connected to the corresponding conductive pad 106. A material of dielectric layer may include an organic insulating material, such as plastic, polyimide, acrylic material, or an inorganic insulating material, such as silicon oxide or silicon nitride, but the present disclosure is not limited thereto. In this embodiment, at least one conductive pad 106 is electrically connected to one of the pads 1142. Also, bonding material 116 may be formed on the pads 1142 of third patterned conductive layer 114c, so as to facilitate the bonding between the pads 1142 and the following disposed electronic devices. The bonding material for example includes tin, nickel gold, or nickel palladium gold, but the present disclosure is not limited thereto.

After forming the redistribution layer 110, the manufacturing method of this embodiment may optionally dispose the electronic device 118, but the present disclosure is not limited thereto. Specifically, at least one chip pad 118a of the electronic device 118 may be bonded to the bonding material 116 (for example by eutectic bonding method), so as to further be electrically connected to the corresponding pad 1142. Accordingly, the electronic device 118 can be electrically connected to the conductive pad 106 through the redistribution layer 110. The electronic device 118 may be for example semiconductor chip, a processor, a die, an IC or other active/passive related devices, but the present disclosure is not limited thereto. The chip pad 118a may include for example tin, nickel, gold, an alloy thereof, etc., but present disclosure is not limited thereto. In addition, the number or the kind of electronic device 118 disposed on the redistribution layer 110 is not limited to be one, and one or more kinds of electronic device 118 or any number of the electronic device 118 may be bonded in this step according to product requirement. After the electronic device 118 is bonded to the bonding material 116, an encapsulation layer 120 is formed on the redistribution layer 110. In this embodiment, the encapsulation layer 120 is mainly disposed at outside of the electronic device 118, and the encapsulation layer 120 substantially doesn't cover the top surface of the electronic device 118, but the present disclosure is not limited thereto. In a variant embodiment, the encapsulation layer 120 may also cover the top surface of the electronic device 118. The encapsulation layer 120 may for example include thermoset plastics, such as epoxy resin, but the present disclosure is not limited thereto. In another variant embodiment, the encapsulation layer 120 may be disposed between the electronic device 118 and the redistribution layer 110.

Referring to FIG. 2, the release layer 104 and the carrier substrate 102 are then removed. In this embodiment, the release layer 104 and the carrier substrate 102 are released from a bottom surface of protecting layer 108 and bottom surfaces of the conductive pads 106. A method for removing the releasing layer 104 may for example include utilizing a laser beam to illuminate the release layer 104 so as to remove the adhesion of the release layer 104 and followed by performing a lift-off process to release the carrier substrate 102 and the release layer 104 from the bottom surface of the protecting layer 108 and the bottom surfaces of the conductive pads 106. A wavelength of the laser beam for removing adhesion may be for example 308 nm, 352 nm or 532 nm, but the present disclosure is not limited thereto. In another embodiment, the method for removing the release layer 104 may utilize a mechanical release method to directly separate the release layer 104 from the bottom surface of the protecting layer 108 and the bottom surfaces of the conductive pads 106. It is noted that according to the product requirement, the electronic device 118 may be bonded to the redistribution layer 110, or the step of disposing the electronic device 118 may selectively not be performed.

After removing the release layer 104 and the carrier substrate 102, a cleaning process 122 is performed to clean residual carbide or remaining viscose in the step of removing the releasing layer 104 and the carrier substrate 102. Since the protecting layer 108 covers the top surface of the conductive pads 106, which means the protecting layer 108 is disposed between the conductive pads 106, a part of protecting layer 108 and the conductive pads 106 are in contact with the release layer 104, so as to expose a part of the bottom surface of the protecting layer 108 and the bottom surfaces of the conductive pads 106 after removing the release layer 104 and the carrier substrate 102. The cleaning process of this embodiment is performed on the part of the bottom surface of the protecting layer 108 and the bottom surfaces of the conductive pads 106 to facilitate following test of resistance between the conductive pad 106 and the solder ball 124 or to improve the electrical connection between the conductive pads 106 and the solder balls 124. The cleaning process may include a plasma cleaning process or a wet cleaning process, but the present disclosure is not limited thereto. It is noted that the cleaning process may apply a material that doesn't easily damage conductive pads 106 and the protecting layer 108, so that the cleaning process won't damage the exposed protecting layer 108 and the exposed conductive pads 106 during performing the cleaning process. Furthermore, since the protecting layer 108 covers a whole of the conductive pads 106 and the release layer 104, in the cleaning process, the protecting layer 108 may protect the lowest first dielectric layer 112a in the redistribution layer 110 from damage by the plasma or detergent of the cleaning process. For example, since the material of the first dielectric layer 112a, such as organic insulating material, is different from the metal material of the conductive pad 106, the cleaning process has obvious etching selectivity ratio of the first dielectric layer 112a including the organic insulating material relative to the conductive pads 106, which means if no protecting layer 108 exists, the etching rate of the cleaning process to the first dielectric layer 112a is faster than the etching rate of the cleaning process to the conductive pads 106, so that for effectively cleaning the bottom surfaces of the conductive pads 106, the first dielectric layer 112a including the organic insulating material will be damaged and even to expose the first patterned conductive layer 114a, thereby resulting in failure of the redistribution layer 110. Through the protection of the protecting layer 108 including the conductive material in this embodiment, the first dielectric layer 112a can be avoided damage from the cleaning process, and the bottom surfaces of the conductive pads 106 may also be effectively cleaned so as to reduce the contacting resistance of the conductive pads 106.

After cleaning process, an etching process is performed to etch the protecting layer 108 and expose the redistribution layer 110. In this embodiment, a part of the protecting layer 108 covers the top surfaces of the conductive pads 106, and another part of the protecting layer 108 is disposed between the conductive pads 106, so the etching process will etch and remove the part of the protecting layer 108 between the conductive pads 106 and the part of the protecting layer 108 between the conductive pads 106 and the redistribution layer 110 remains, thereby forming at least one protecting block 108a. Since the number of the conductive pads 106 of this embodiment is plural, the number of the protecting blocks 108a may also be plural, but the present disclosure is not limited thereto. Also, the protecting blocks 108a may be separated from each other, and each protecting block 108a may respectively cover a corresponding conductive pad 106 in the top view direction Z. For example, when the protecting layer 108 and the conductive pads 106 are formed of the same material, the conductive pads 106 and the protecting layer 108 may have the same etching selectivity. Since the thickness of the protecting layer 108 is much less than the thickness of the conductive pads 106, the etching process may keep large part of each conductive pad 106 after completely removing the part of the protecting layer 108 between the conductive pads 106. In other words, when the redistribution layer 110 is exposed, the etching process is stopped. The etching process for etching the protecting layer 108 may be for example a dry etching process or a wet etching process.

After removing the part of the protecting layer 108 between the conductive pads 106, a solder ball may be optionally formed on each conductive pad 106. The solder balls 124 generally can be divided into five types: normal solder ball (which has a melting point in a range from 180° C. to 316° C.), low temperature solder ball (which includes bismuth or indium and has a melting point in a range from 95° C. to 135° C.), high temperature solder ball (which has a melting point in a range from 186° C. to 309° C.), fatigue-resistant high purity solder ball (which has a melting point of 178° C. or 183° C.), lead-free solder ball (in which a content of lead in the components of the lead-free solder ball is less than 0.1%), but the present disclosure is not limited thereto. Thereafter, a cutting process is performed to form at least one package device 100, in which the cutting process may be for example a laser cutting process, a wheel cutting process or a punch process, but the present disclosure is not limited thereto. The cutting positions in the cutting process may be determined according to the product requirement, for example the cutting process cuts along a cutting line D1, so that the package device 100 may include at least one electronic device 118, but the present disclosure is not limited thereto. Through the cutting process, the package device 100 may have any number of electronic devices 118 or a stack of multiple electronic devices, and the numbers of the electronic devices 118 in different package devices 100 may be the same or different, but the present disclosure is not limited thereto. In one embodiment, an inspecting step may be selectively performed between the etching process for etching the protecting layer 108 and the step of forming the solder balls 124 to open-circuit test, short-circuit test and functional test. It is noted that as compared with the decrease of the cleanliness of the conductive pads 106 due to avoiding damaging dielectric layer in the cleaning process, the cleaning process and the etching process of this embodiment can effectively clean the bottom surfaces of the conductive pads 106, such that number of defect products that is inspected in the inspecting step because of bad resistance can be reduced, thereby increasing product yield. Furthermore, cleaning the bottom surfaces of the conductive pads 106 by the cleaning process and the etching process facilitates the adhesions of the solder balls 124 respectively to the bottom surfaces of the conductive pads 106, so as to avoid high resistance generated from insufficient bonding between the solder balls 124 and the conductive pads 106 or avoid open-circuit resulted from the solder balls 124 coming off the conductive pads 106, thereby increasing the product yield.

In another embodiment, the package device may be for example a flexible circuit board. In other words, the package device may not include the electronic device, and the redistribution layer 110 functions as a circuit board, which means the manufacturing method of the package device may not include the step of disposing the electronic device 118 on the redistribution layer 110 shown in FIG. 1 of the first embodiment, but the present disclosure is not limited thereto. After forming the redistribution layer 110, the release layer 104 and the carrier substrate 102 are removed and followed by performing the cleaning process. Thereafter, the protecting layer 108 is etched, and the solder balls 124 are selectively formed on the bottom surfaces of the conductive pads 106 respectively. Then, a cutting process is performed to form a package device. It is noted that as compared with utilizing printing process to form conductive lines of the patterned conductive layer in the conventional circuit board, the redistribution layer 110 of this embodiment manufactured by the photolithography and etching process can have conductive lines with smaller width and less spacing, so that the redistribution layer 110 with higher integration can be achieved.

The package device and the manufacturing method thereof of the present disclosure are not limited to the above-mentioned embodiment. The following description will detail the different embodiments or variant embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 3:
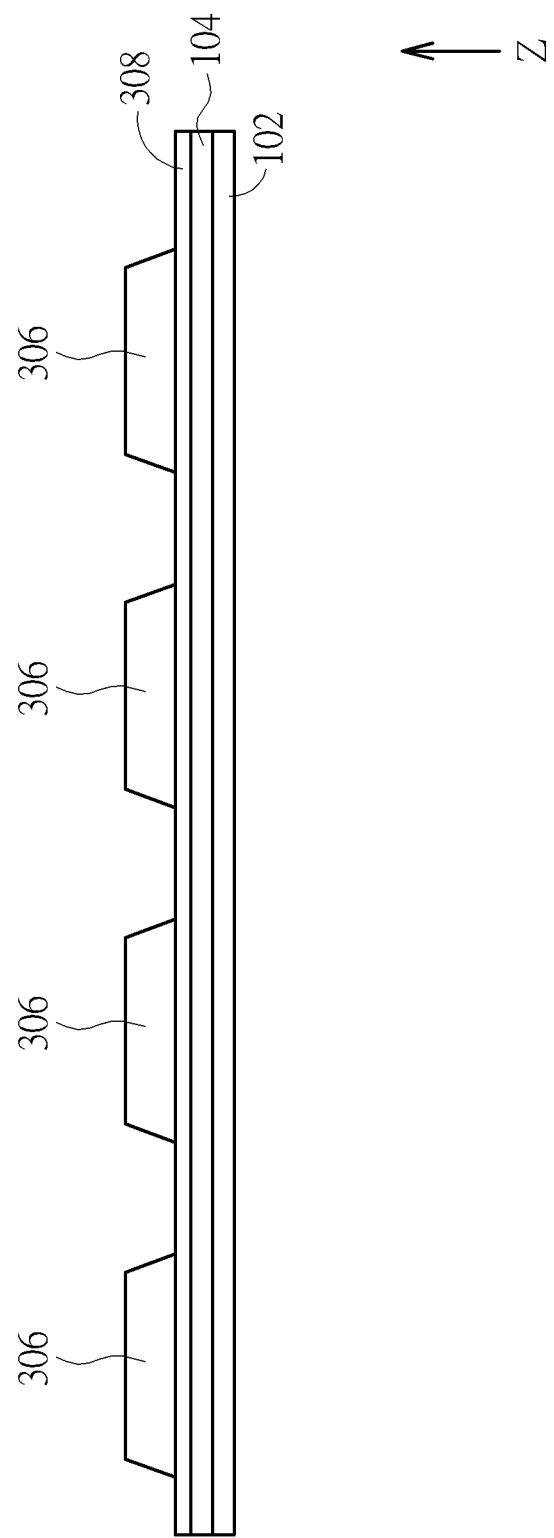
FIG. 3 to FIG. 5 are schematic diagrams illustrating a manufacturing method of a package device according to a second embodiment of the present disclosure.
Figure 4:
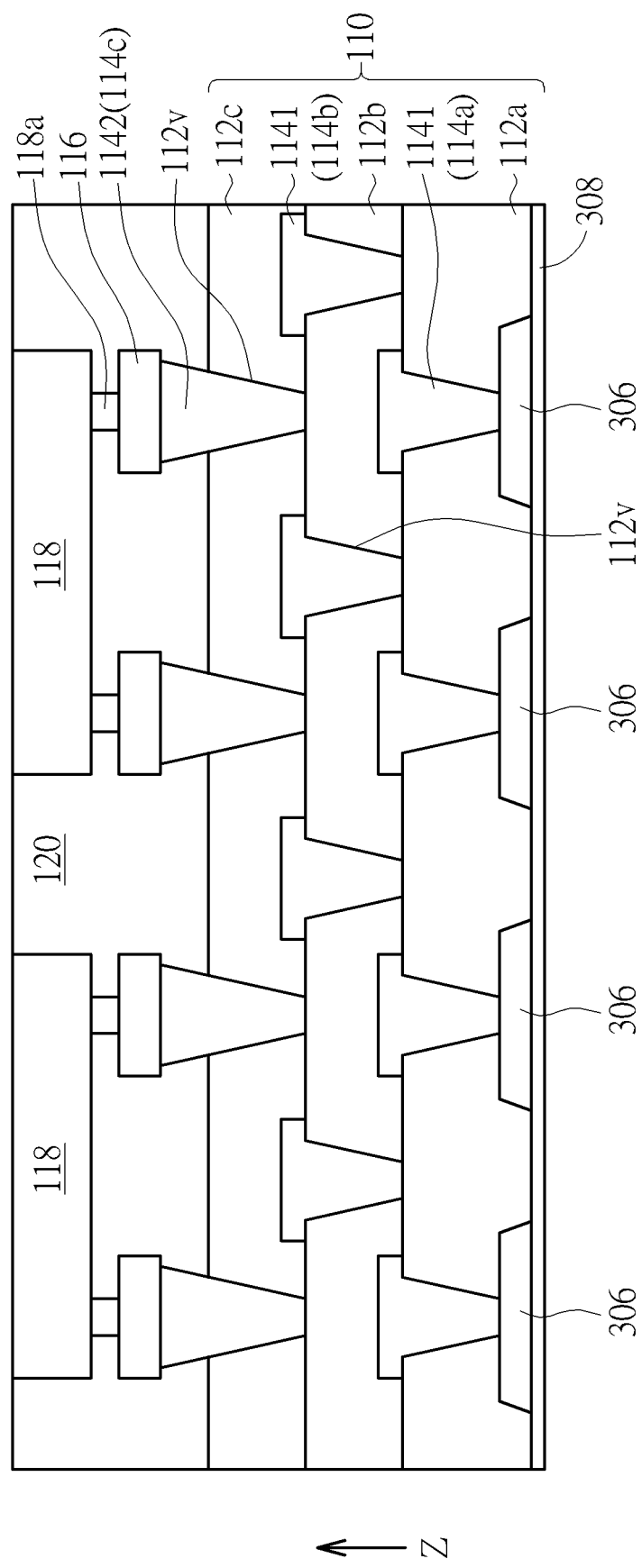
Figure 5:
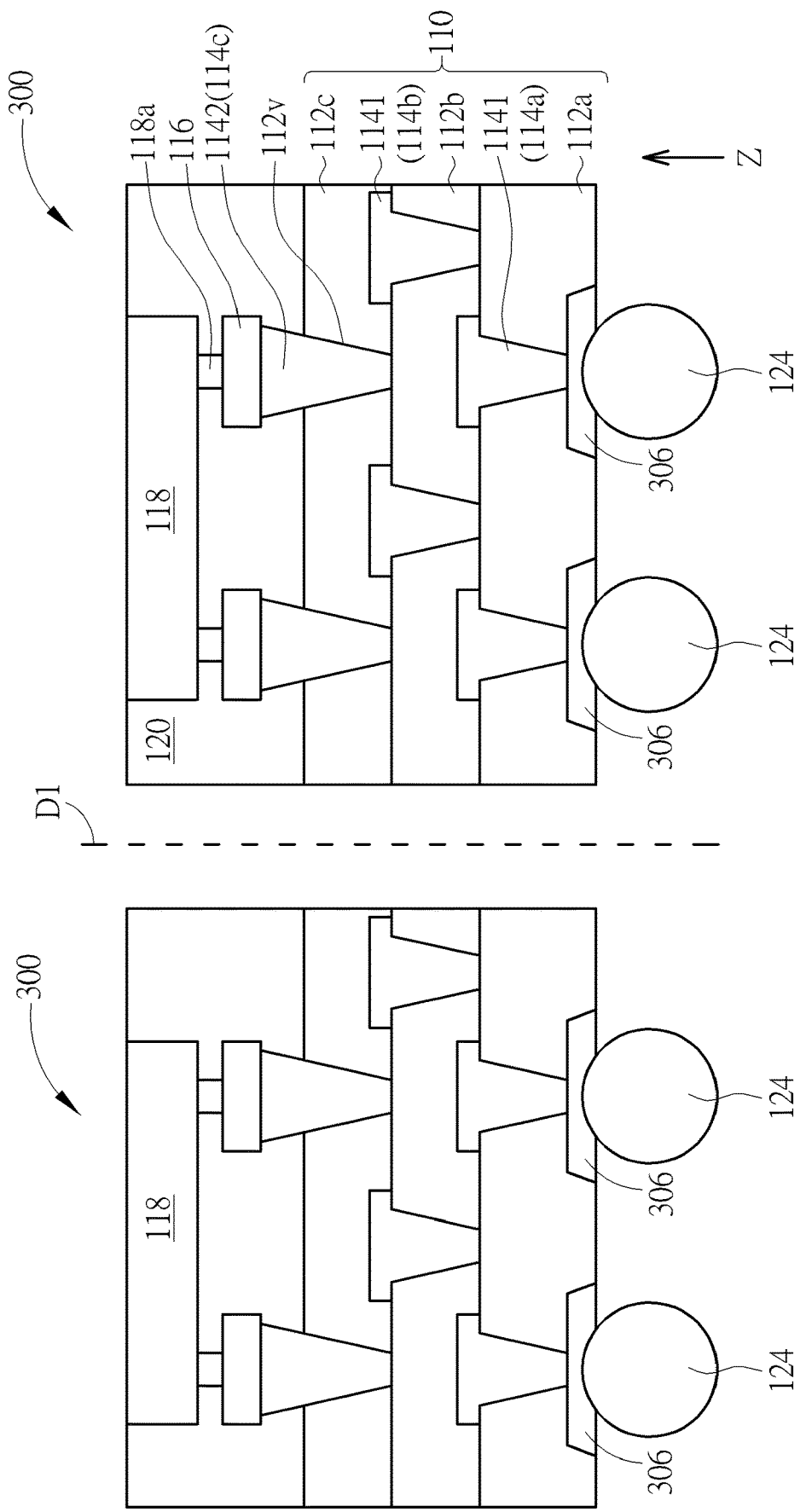

FIG. 3 to FIG. 5 are schematic diagrams illustrating a manufacturing method of a package device according to a second embodiment of the present disclosure, in which device structures in each step are illustrated in a cross-sectional view. A difference between the manufacturing method of the package device of the second embodiment and the manufacturing method of the package device of the first embodiment is that a protecting layer 308 of this embodiment is formed between the conductive pads 306 and the release layer 104. Specifically, referring to FIG. 3, the step of forming the release layer 104 on the carrier substrate 102 of this embodiment is the same as the first embodiment, and will not be redundantly detailed. After that, the protecting layer 308 is formed on the release layer 104. A conductive layer (not shown in the figures) is then formed on the protecting layer 308 and followed by etching the conductive layer through the photolithography and etching process to form the conductive pads 306 on the protecting layer 308.

Referring to FIG. 4, after forming the conductive pads 306, a redistribution layer 110 is formed on the conductive pads 306. In this embodiment, the electronic device 118 may be further disposed on the redistribution layer 110, and the encapsulation layer 120 may be formed on the redistribution layer 110. Later, the release layer 104 and the carrier substrate 102 are removed to expose the bottom surface of the protecting layer 308. Thereafter, a cleaning process is performed on the bottom surface of the protecting layer 308. Since the protecting layer 308 covers a whole top surface of the release layer 104 and is disposed on the bottom surface of the conductive pads 306, which means the protecting layer 308 not only covers the bottom surface of the redistribution layer 110 but also covers the bottom surfaces of the conductive pads 306, the cleaning process cleans the bottom surface of the protecting layer 308 rather than cleans two different materials. For this reason, the protecting layer 308 may include any material that is able to resist the cleaning process, for example a material the same as the material of the first embodiment or insulating material, but the present disclosure is not limited thereto. In another embodiment, after forming the redistribution layer 110, the electronic device 118 may not be disposed, and the encapsulation layer 120 may not be formed. In such situation, the release layer 104 and the carrier substrate 102 may be directly removed.

Referring to FIG. 5, after the cleaning process, the protecting layer 308 is etched to remove a whole of the protecting layer 308, so as to expose the conductive pads 306. Then, the solder balls 124 may be selectively formed on the conductive pads 306 and followed by performing a cutting process to form at least one package device 300.

Figure 6:
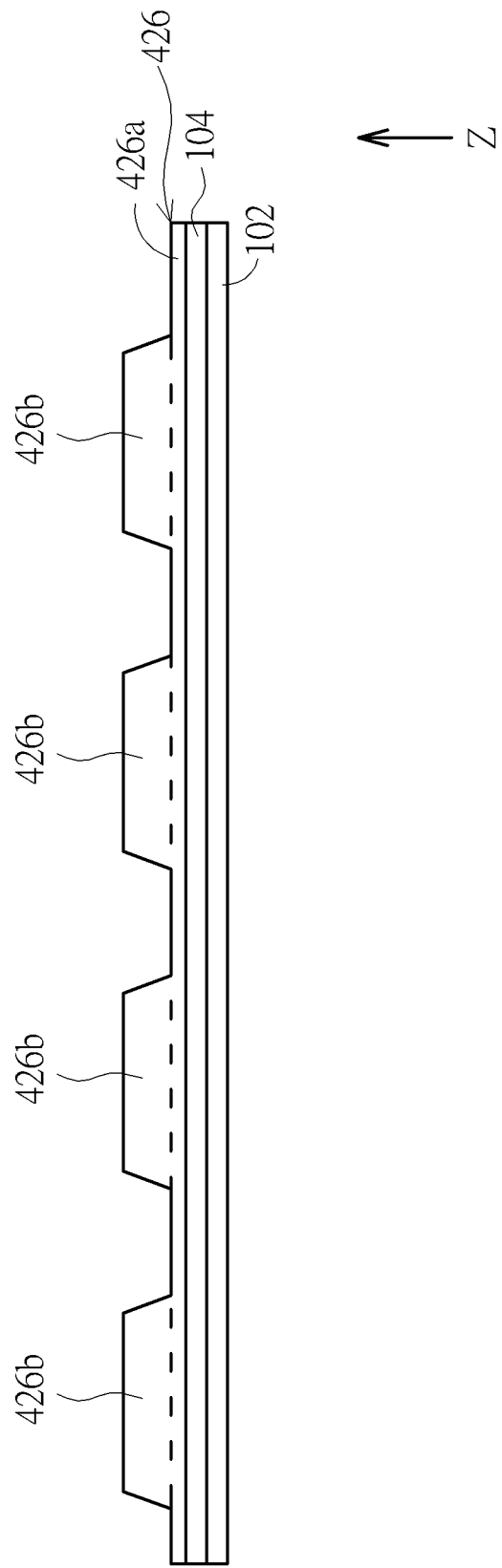
FIG. 6 and FIG. 7 are schematic diagrams illustrating a manufacturing method of a package device according to a third embodiment of the present disclosure.
Figure 7:
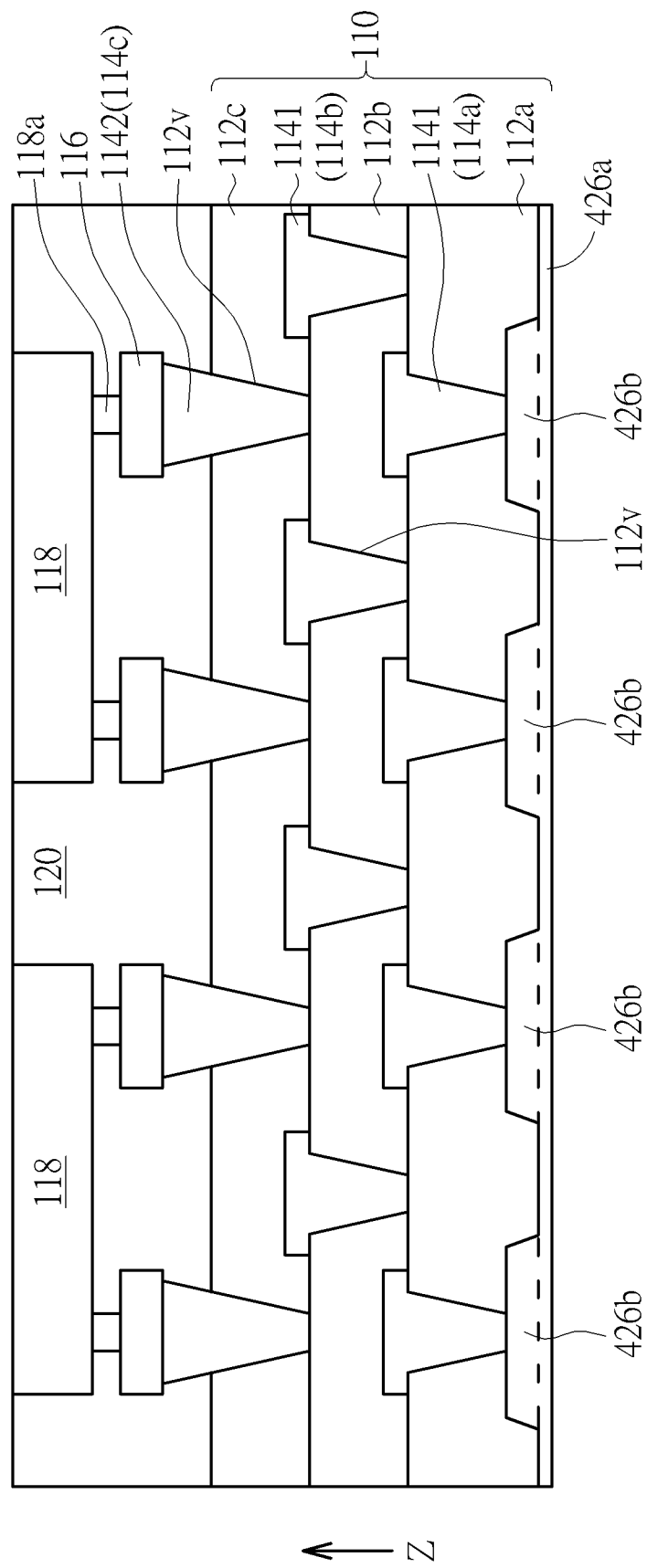

FIG. 6 and FIG. 7 are schematic diagrams illustrating a manufacturing method of a package device according to a third embodiment of the present disclosure, in which device structures in each step are illustrated in a cross-sectional view. A difference between the manufacturing method of the package device of the third embodiment and the manufacturing method of the package device of the second embodiment is that the protecting layer 426a and the conductive pads 426b are formed of a same conductive layer 426 in this embodiment. Specifically, referring to FIG. 6, the step of forming the release layer 104 on the carrier substrate 102 of this embodiment is the same as the second embodiment, and will not be redundantly detailed. After that, a conductive layer 426 is formed on the release layer 104, in which the conductive layer 426 may have a uniform thickness, but the present disclosure is not limited thereto. Later, a photoresist pattern (not shown in figures) is formed on the conductive layer 426 and used for defining positions of the conductive pads 426b. An etching process using the photoresist pattern as a mask is performed on the top surface of the conductive layer 426, so as to remove a part of the conductive layer 426 that is not covered by photoresist pattern and accordingly form the protecting layer 426a and the conductive pads 426b. Following that, the photoresist pattern is removed. In the etching process of this embodiment, the thickness of the part of the conductive layer 426 covered by the photoresist pattern is thicker than the thickness of the part of the conductive layer 426 that is not covered by the photoresist pattern (after etching), which means the etching process doesn't etch through the conductive layer 426 and is stopped when the etching depth reaches a certain proportion of the conductive layer 426. In this embodiment, the protecting layer 426a is a part of the remaining conductive layer 426, the conductive pads 426b are another part of the remaining conductive layer 426, and the protecting layer 426a is disposed between the conductive pads 426b and the release layer 104 for protecting the redistribution layer 110 from damage during the cleaning process or the etching process. Since the protecting layer 426a and the conductive pads 426b are formed of the same conductive layer 426 in this embodiment, the protecting layer 426a and the conductive pads 426b may be formed of a same material, such as metal material, but the present disclosure is not limited thereto.

Referring to FIG. 7, after the protecting layer 426a and the conductive pads 426b are formed, the steps in the manufacturing method of this embodiment may be the same as the second embodiment. Specifically, the redistribution layer 110 is formed on the protecting layer 426a and the conductive pads 426b. Then, the electronic device 118 is disposed on the redistribution layer 110, and followed by forming the encapsulation layer 120 on the redistribution layer 110. Later, the release layer 104 and the carrier substrate 102 are removed to expose the bottom surface of the protecting layer 426a and followed by performing the cleaning process on the bottom surface of the protecting layer 426a. Thereafter, the etching process is performed until the redistribution layer 110 and the conductive pads 426b are exposed. Afterward, the solder balls 124 may be optionally formed on the conductive pads 426b and followed by performing the cutting process to form the package device that is the same as the package device of the second embodiment, as shown in FIG. 5. In another embodiment, after forming the redistribution layer 110, there is no need to dispose the electronic device and to form the encapsulation layer 120. In such situation, the release layer 104 and the carrier substrate 102 is directly removed.

Figure 8:
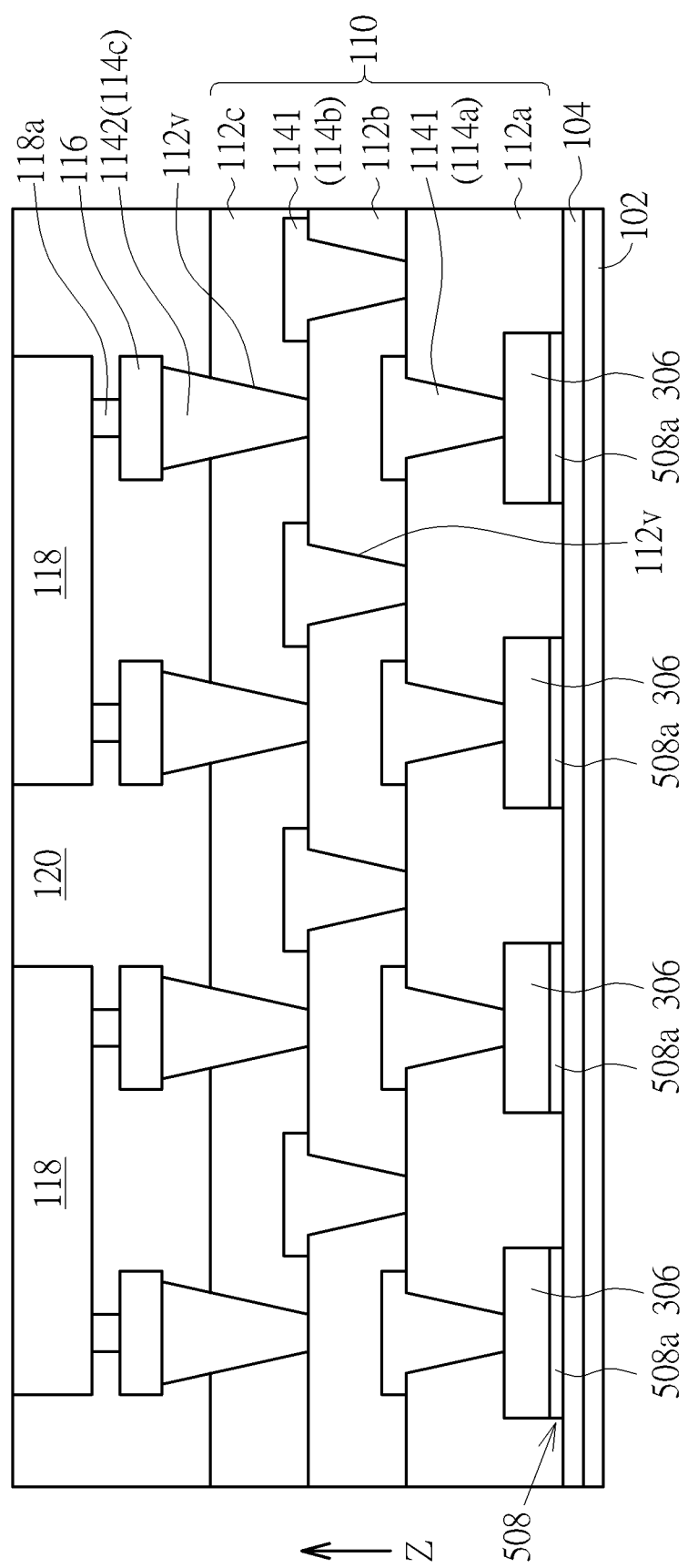
FIG. 8 and FIG. 9 are schematic diagrams illustrating a manufacturing method of a package device according to a fourth embodiment of the present disclosure.
Figure 9:
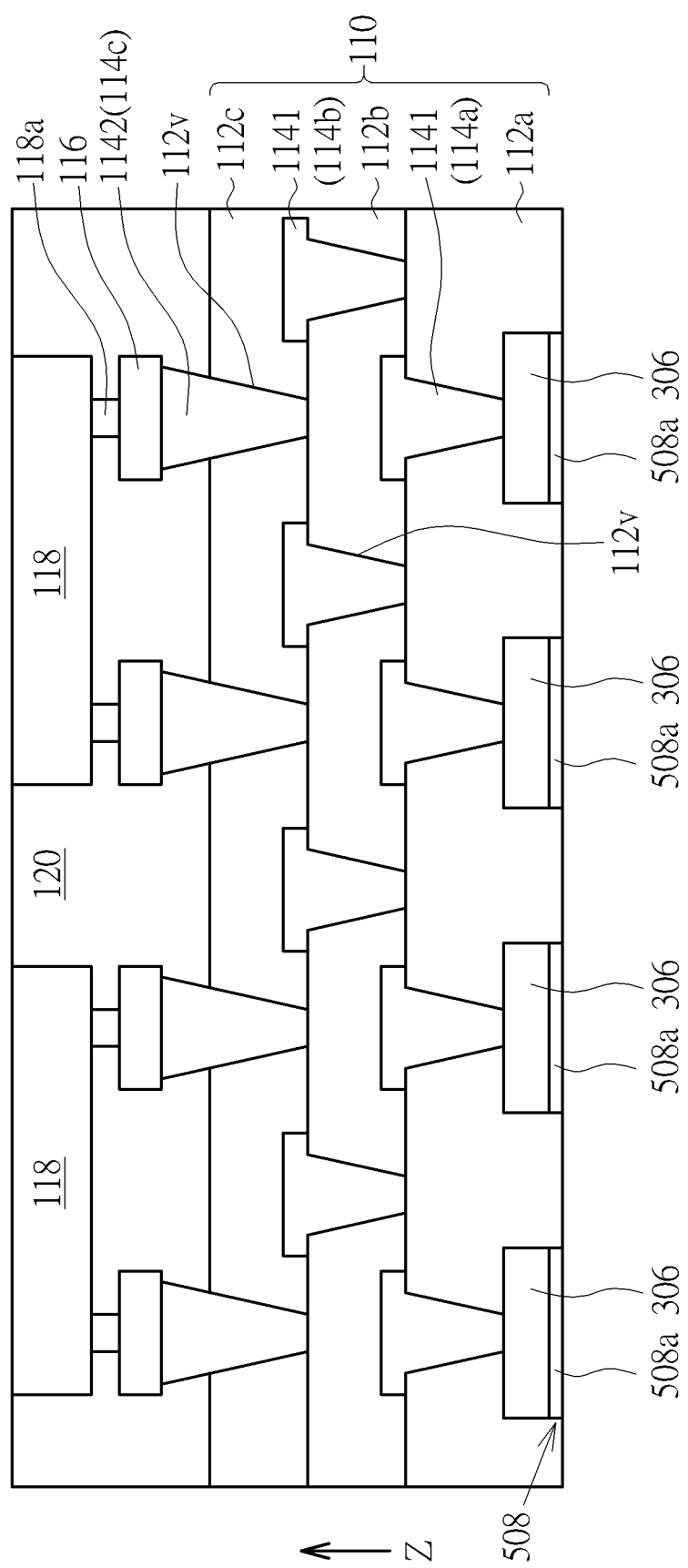

FIG. 8 and FIG. 9 are schematic diagrams illustrating a manufacturing method of a package device according to a fourth embodiment of the present disclosure, in which device structures in each step are illustrated in a cross-sectional view. A difference between the manufacturing method of the package device of the fourth embodiment and the manufacturing method of the package device of the second embodiment is that the protecting layer 508 of this embodiment includes a plurality of protecting blocks 508a formed of insulating material, and the protecting blocks 508a are disposed between the conductive pads 306 and the release layer 104. Specifically, as shown in FIG. 8, the step of forming the release layer 104 on the carrier substrate 102 in this embodiment is the same as that in the second embodiment, and will not be redundantly detailed. After that, a protecting material layer (not shown in figures) is formed on the release layer 104. Then, the protecting material layer is patterned by a photolithography and an etching process, so as to form the protecting layer 508 including the protecting blocks 508a and expose a part of release layer 104. The protecting blocks 508a may be separated from each other. Later, a conductive layer (not shown in figures) is formed on the protecting blocks 508a and the release layer 104 and followed by etching the conductive layer through a photolithography and etching process, so as to form the conductive pads on the protecting blocks 508a. In another embodiment, the protecting material layer (not shown in the figures) including the insulating material and the conductive layer (not shown in the figures) are formed on the release layer 104, in which the protecting material layer is disposed between the conductive layer and the release layer 104. Then, the protecting material layer and the conductive layer are patterned by the same photolithography and etching process to form the protecting blocks 508a and the conductive pads 306 and expose a part of the release layer 104.

As shown in FIG. 8, after the conductive pads 306 are formed, the redistribution layer 110 is formed on the conductive pads 306 and the release layer 104, which means the dielectric layer 112a of the redistribution layer 110 of this embodiment may be in contact with the release layer 104. Then, the electronic device 118 is disposed on the redistribution layer 110 and followed by forming the encapsulation layer 120 on the redistribution layer 110.

As shown in FIG. 9, the release layer 104 and the carrier substrate 102 are then removed to expose the bottom surfaces of the protecting blocks 508a and the bottom surface of the first dielectric layer 112a. Afterward, the cleaning process is performed on the bottom surfaces of the protecting blocks 508a and the bottom surface of the first dielectric layer 112a. It is noted that the protecting blocks 508a and the first dielectric layer 112a may be formed of the same material or formed of different material with etching rates that are almost the same, so that in the cleaning process, the etching etchant will not have obvious difference between the etching rate to the protecting blocks 508a and the etching rate to the first dielectric layer 112a, thereby preventing one of the protecting blocks 508a and the first dielectric layer 112a from damage due to over etching. Furthermore, a material of the protecting block 508a may include metal material, such as aluminum (Al), molybdenum (Mo), titanium (Ti), tungsten (W), copper (Cu), gold (Au), chromium (Cr), etc., a compound, such as an alloy of aluminum and neodymium (AlNd), molybdenum nitride (MoN), chromium oxide (CrO), indium tin oxide (ITO), indium zinc oxide (IZO), etc., or inorganic material, such as silicon oxide, silicon nitride, etc., or organic material, such as polyimide, etc., but the present disclosure is not limited thereto. The etching process may be a wet etching process or a dry etching process, for example the etching etchant of the wet etching process may be potassium hydroxide (KOH), and the dry etching may be a plasma etching utilizing tetrafluoromethane (CF4) gas/oxygen (O2) gas, but the present disclosure is not limited thereto. In another embodiment, after the redistribution layer 110 is formed, no electronic device 118 may be disposed, and no encapsulation layer 120 may be formed. In such situation, the release layer 104 and the carrier substrate 102 are directly removed. In this embodiment, in order that the etching etchant doesn't meet the conductive pads 306, the protecting blocks 508a covers a whole of the conductive pads 306 in the top view direction Z, so that the conductive pads 306 won't be exposed after removing the release layer 104. For example, an area of each protecting block 508a may be greater than an area of each conductive pad 306.

After the cleaning process, the protecting blocks 508a and the first dielectric layer 112a are etched to remove the protecting blocks 508a and a part of first dielectric layer 112a and to expose the conductive pads 306. Then, the solder balls 124 are selectively formed on the conductive pads 306 respectively. In another embodiment, the protecting block 508a and the first dielectric layer 112a may use materials with large difference in etching rate, in which the etching rate of the protecting blocks 508a is greater than the etching rate of the first dielectric layer 112a. In such situation, the protecting blocks 508a can be fully etched during etching while the first dielectric layer 112a is not over etched, such that the conductive pads 306 are exposed and located at a plane different from the first dielectric layer 112a. Then, the solder balls are formed on the conductive pads 306, and the method of this embodiment will help to increase the adhesion between the solder balls and the conductive pads 306. Following that, a cutting process is performed to form at least one package device 300, as shown in FIG. 5.

Figure 10:
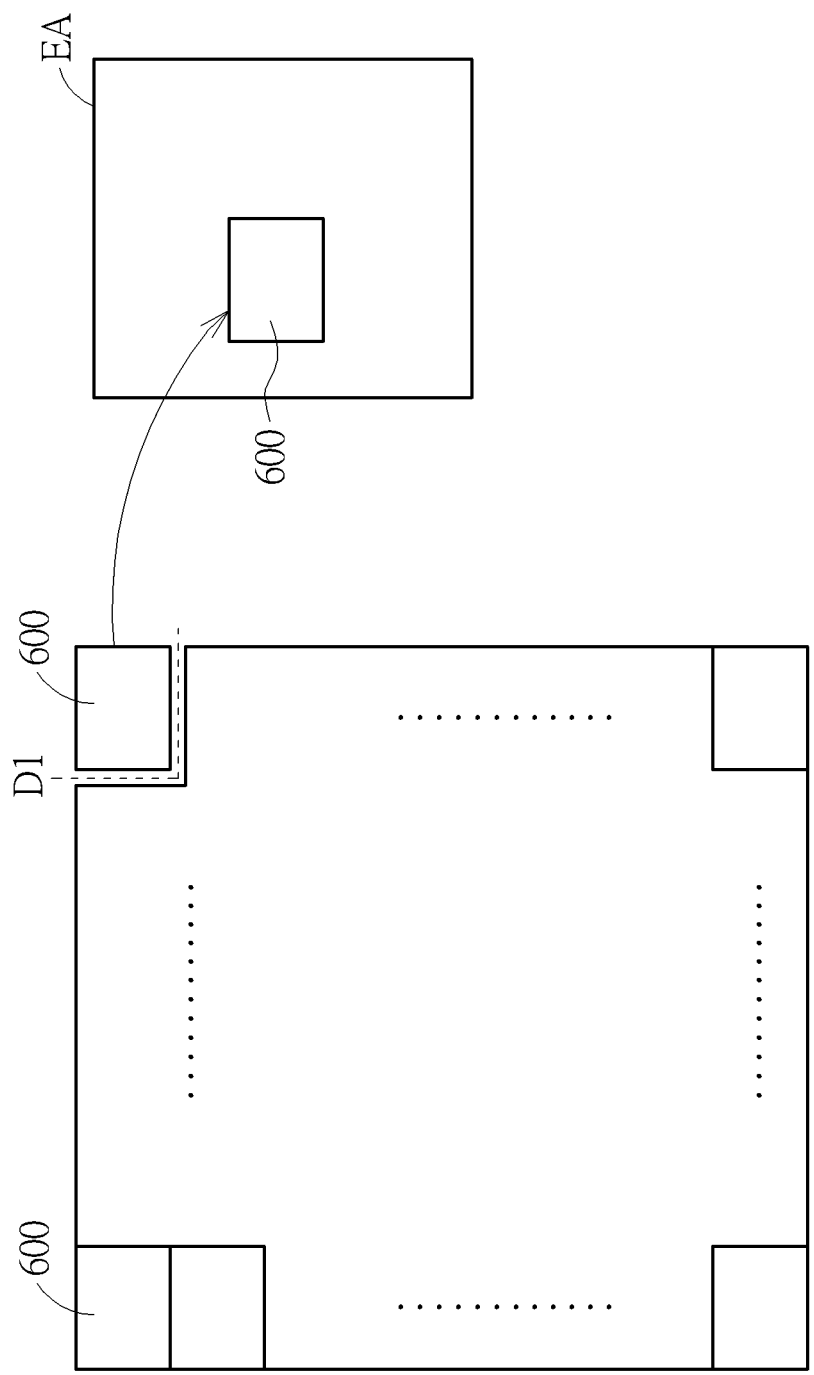
FIG. 10 is a schematic diagram illustrating a package device applied to an electronic apparatus according to an example of the present disclosure.

Each of the package devices manufactured by the above-mentioned embodiments may further be applied to an electronic apparatus. That is, the package device may be bonded to and electrically connected to any one of circuit boards or devices in the electronic apparatus through a die bonding method. FIG. 10 is a schematic diagram illustrating a package device applied to an electronic apparatus according to an example of the present disclosure. As shown in FIG. 10, the package device 600 formed by the cutting process cutting along a cutting line D1 may be further disposed in any one kind of electronic apparatus EA, for example the package device 600 is disposed in a mobile device, but the present disclosure is not limited thereto. Also, the package device 600 of this embodiment may be the package device of any one of above-mentioned embodiments.

To sum up, in the package device and the manufacturing method thereof of the present disclosure, between forming the release layer and forming the redistribution layer, the protecting layer is further formed to fully cover the release layer, so as to protect the formed redistribution layer from damage during the cleaning process or the etching process. Accordingly, the cleaning process may effectively clean the protecting layer or the bottom surface of the conductive pads. For this reason, the solder balls are helped to be adhered to the bottom surfaces of the conductive pads, so as to avoid high resistance generated from insufficient bonding between the solder balls and the conductive pads or avoid the open-circuit resulted from the solder balls coming off the conductive pads, thereby increasing the product yield.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A package device, comprising:
   a conductive pad;
   a protecting block, disposed on and directly in contact with the conductive pad, wherein the protecting block covers a top surface of the conductive pad and all sidewalls of the conductive pad;
   a redistribution layer, disposed on and directly in contact with the protecting block, and the conductive pad being electrically connected to the redistribution layer through the protecting block, wherein a bottom surface of the redistribution layer is level with a bottom surface of the conductive pad, and the redistribution layer comprises a dielectric layer extending to be in contact with a top surface of the protecting block; and
   a solder ball, disposed under and directly in contact with the conductive pad.

2. The package device according to claim 1, wherein the conductive pad and the protecting block are formed of a same material.

3. The package device according to claim 1, wherein the protecting block comprises a conductive material.

4. The package device according to claim 1, wherein the conductive pad and the protecting block have different thicknesses.

5. The package device according to claim 1, further comprising an electronic device, disposed on the redistribution layer, wherein the conductive pad is electrically connected to the electronic device through the protecting block and the redistribution layer.

6. The package device according to claim 5, wherein the redistribution layer comprises at least one dielectric layer and at least one patterned conductive layer, and the conductive pad is electrically connected to the electronic device through the at least one patterned conductive layer.

7. The package device according to claim 5, further comprising an encapsulation layer disposed between the electronic device and the redistribution layer.

8. The package device according to claim 1, wherein the redistribution layer comprises a dielectric layer and a patterned conductive layer, the dielectric layer has a through hole, the patterned conductive layer is filled into the through hole.

9. The package device according to claim 8, wherein the patterned conductive layer has a pad exposed at a top surface of the redistribution layer.

* * * * *